United States Patent
Chuang et al.

(10) Patent No.: US 6,833,998 B2
(45) Date of Patent: Dec. 21, 2004

(54) CIRCUIT BOARD ASSEMBLY WITH SEPARABLE FIRST AND SECOND CIRCUIT BOARD DEVICES

(75) Inventors: Wei-Pin Chuang, Taipei (TW); Chih-Chuan Cheng, Taipei (TW)

(73) Assignee: Compal Electronics, Inc., Taipei (TW)

( * ) Notice: Subject to any disclaimer, the term of this patent is extended or adjusted under 35 U.S.C. 154(b) by 17 days.

(21) Appl. No.: 10/331,486

(22) Filed: Dec. 31, 2002

(65) Prior Publication Data

US 2004/0090761 A1 May 13, 2004

(30) Foreign Application Priority Data

Nov. 15, 2002 (TW) ........................................ 91218429 U

(51) Int. Cl.[7] ............................. H05K 1/11; H05K 1/14
(52) U.S. Cl. ........................................ 361/803; 361/785
(58) Field of Search ............................... 361/760–761, 361/803, 785–790; 439/61, 76; 359/163

(56) References Cited

U.S. PATENT DOCUMENTS 5,488,541 A * 1/1996 Mistry et al. ............... 361/788
5,827,074 A * 10/1998 Gatti ........................... 439/61
6,324,071 B2 * 11/2001 Weber et al. ................ 361/785
6,496,376 B1 * 12/2002 Plunkett et al. ............. 361/729

* cited by examiner

Primary Examiner—Kamand Cuneo
Assistant Examiner—Tuan Dinh
(74) Attorney, Agent, or Firm—Bacon & Thomas, PLLC

(57) ABSTRACT

A circuit board assembly includes first and second circuit board devices. The first circuit board device includes a printed circuit board, a first controller mounted on the first printed circuit board, and a first communications unit mounted on the first printed circuit board and that is connected electrically to the first controller. The second circuit board device includes a second printed circuit board separate from the first printed circuit board, a second controller mounted on the second printed circuit board, and a second communications unit mounted on the second printed circuit board and connected electrically to the second controller. The second communications unit cooperates with the first communications unit to establish a communications link between the first and second controllers while maintaining separability between the first and second printed circuit boards.

10 Claims, 4 Drawing Sheets

CIRCUIT BOARD ASSEMBLY WITH SEPARABLE FIRST AND SECOND CIRCUIT BOARD DEVICES

CROSS-REFERENCE TO RELATED APPLICATION

This application claims priority of Taiwanese application no. 091218429, filed on Nov. 15, 2002.

BACKGROUND OF THE INVENTION

1. Field of the Invention

The invention relates to a circuit board assembly, more particularly to a circuit board assembly with separable first and second circuit board devices.

2. Description of the Related Art

Electronic devices, such as a personal computer, a portable computer, a personal digital assistant, etc., incorporate a single circuit board device that includes a printed circuit board, and electronic components mounted on the printed circuit board and coupled electrically to each other by means of traces on the printed circuit board.

As shown in FIG. 1, a conventional circuit board device includes a printed circuit board 3, a north bridge chipset 31 mounted on the printed circuit board 3, and a south bridge chipset 35 mounted on the printed circuit board 3 and coupled electrically to the north bridge chipset 31. The north bridge chipset 31 bridges a memory module 33 and a display interface 34 to a central processing unit (CPU) 32. The south bridge chipset 35 bridges peripheral devices connected to a peripheral component interconnect (PCI) port 36, a universal serial bus (USB) port 37, an extended capability (EC) port 38, an integrated drive electronics (IDE) port 39, a small computer system interface (SCSI) port 40, a serial port 41, a parallel port 42, and other peripheral interfaces (not shown), to the north bridge chipset 31.

However, since the north and south bridge chipsets 31, 35 are mounted on the same printed circuit board 3, when the north/south bridge chipset 31, 35 needs to be upgraded, the entire circuit board device has to be replaced with a new one. As such, the south/north bridge chipset 35, 31, which can still be used, is discarded along with the north/south bridge chipset 31, 35. This results in higher costs and additional burden to the environment.

SUMMARY OF THE INVENTION

Therefore, the object of the present invention is to provide a circuit board assembly that includes a first circuit board device and a second circuit board device separate from the first circuit board device so as to overcome the aforesaid drawbacks of the prior art.

According to the present invention, a circuit board assembly comprises first and second circuit board devices. The first circuit board device includes a printed circuit board, a first controller mounted on the first printed circuit board, and a first communications unit mounted on the first printed circuit board and connected electrically to the first controller. The second circuit board device includes a second printed circuit board separate from the first printed circuit board, a second controller mounted on the second printed circuit board, and a second communications unit mounted on the second printed circuit board and connected electrically to the second controller. The second communications unit cooperates with the first communications unit to establish a communications link between the first and second controllers while maintaining separability between the first and second printed circuit boards.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
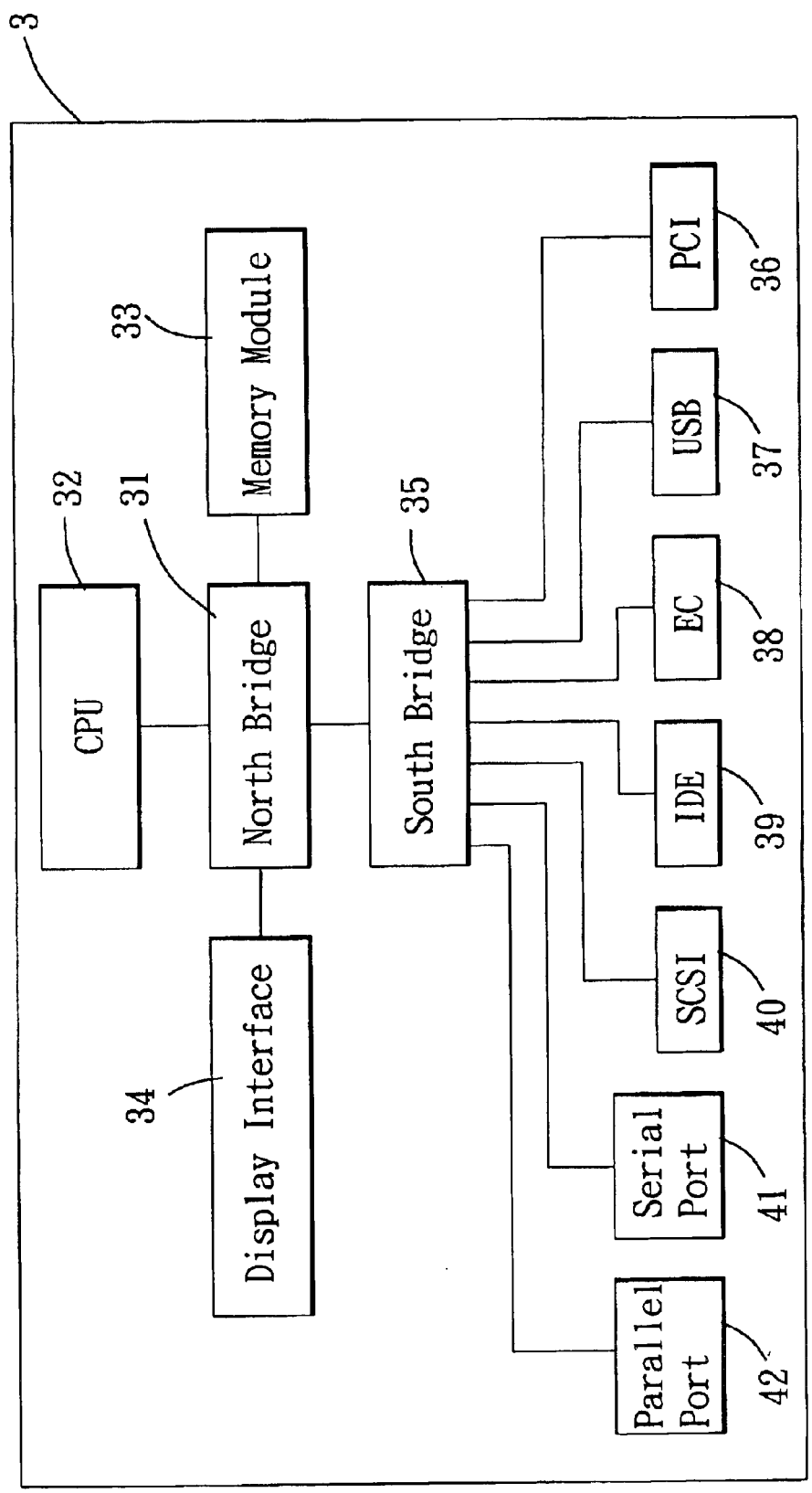
FIG. 1 is a schematic block diagram of a conventional circuit board device.

Before the present invention is described in greater detail, it should be noted that like elements are denoted by the same reference numerals throughout the disclosure.

Figure 2:
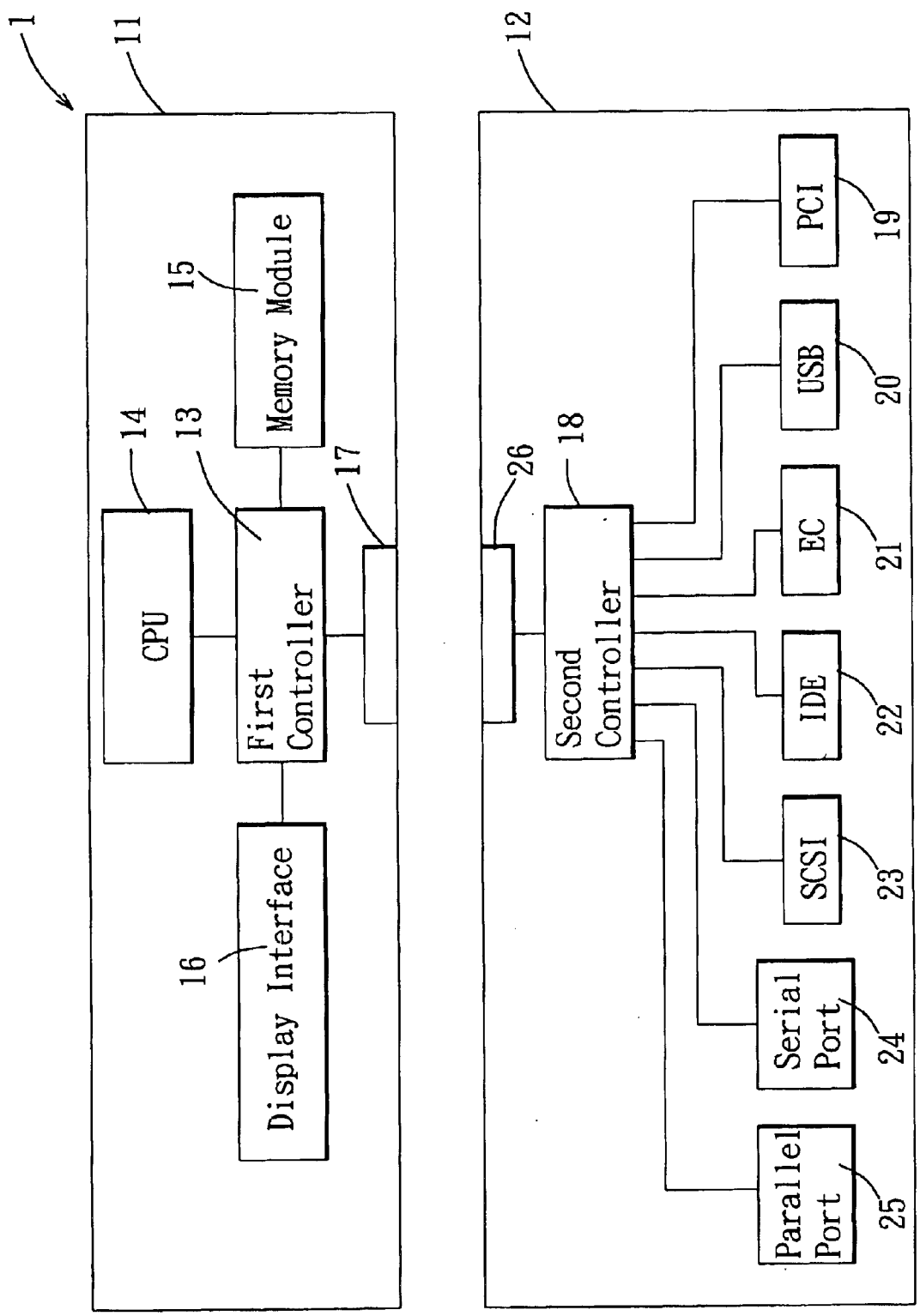
FIG. 2 is a schematic block diagram of the first preferred embodiment of a circuit board assembly according to the present invention.

Referring to FIG. 2, the first preferred embodiment of a circuit board assembly 1 according to the present invention is configured for use in a portable computer (not shown) and is shown to include a first circuit board device and a second circuit board device.

The first circuit board device includes a first printed circuit board 11, a first controller 13 mounted on the first printed circuit board 11, and a first communications unit 17 mounted on the first printed circuit board 11 and connected electrically to the first controller 13.

The first circuit board device further includes a central processing unit (CPU) 14, a memory module 15 and a display interface 16 mounted on the first printed circuit board 11 and connected electrically to the first controller 13. In this embodiment, the first controller 13 is a north bridge chipset that bridges the memory module 15 and the display interface 16 to the CPU 14.

The second circuit board device includes a second printed circuit board 12 separate from the first printed circuit board 11, a second controller 18 mounted on the second printed circuit board 12, and a second communications unit 26 mounted on the second printed circuit board 12 and connected electrically to the second controller 18.

The second circuit board device further includes a peripheral component interconnect (PCI) port 19, a universal serial bus (USB) port 20, an extended capability port (EC) 21, an integrated drive electronics (IDE) port 22, a small computer system interface (SCSI) port 23, a serial port 24, and a parallel port 25 that are mounted on the second printed circuit board 12 and that are connected electrically to the second controller 18. These ports are adapted to be connected to PCI interface cards, such as a sound card, a graphics card, etc., and peripheral devices, such as a hard disk drive, a floppy disk drive, a CD-ROM drive, a printer, a modem, etc. In this embodiment, the second controller 18 is a south bridge chipset that bridges the PCI interface cards and the peripheral devices to the CPU 14 on the first circuit board device (to be described in greater detail in the succeeding paragraphs). In addition, IDE hard disk controller, floppy disk controller, and serial port, parallel port, USB port, power management system and/or sound system functions are usually integrated in the second controller 18.

In this embodiment, the second communications unit 26 cooperates with the first communications unit 17 to establish a wired communications link for transmission and reception of signals between the first and second controllers 13, 18 while maintaining separability between the first and second printed circuit boards 11, 12. In the embodiment of FIG. 2, the first communications unit 17 is a first electrical connector, and the second communications unit 26 is a second electrical connector that is capable of mating removably with the first electrical connector.

Figure 3:
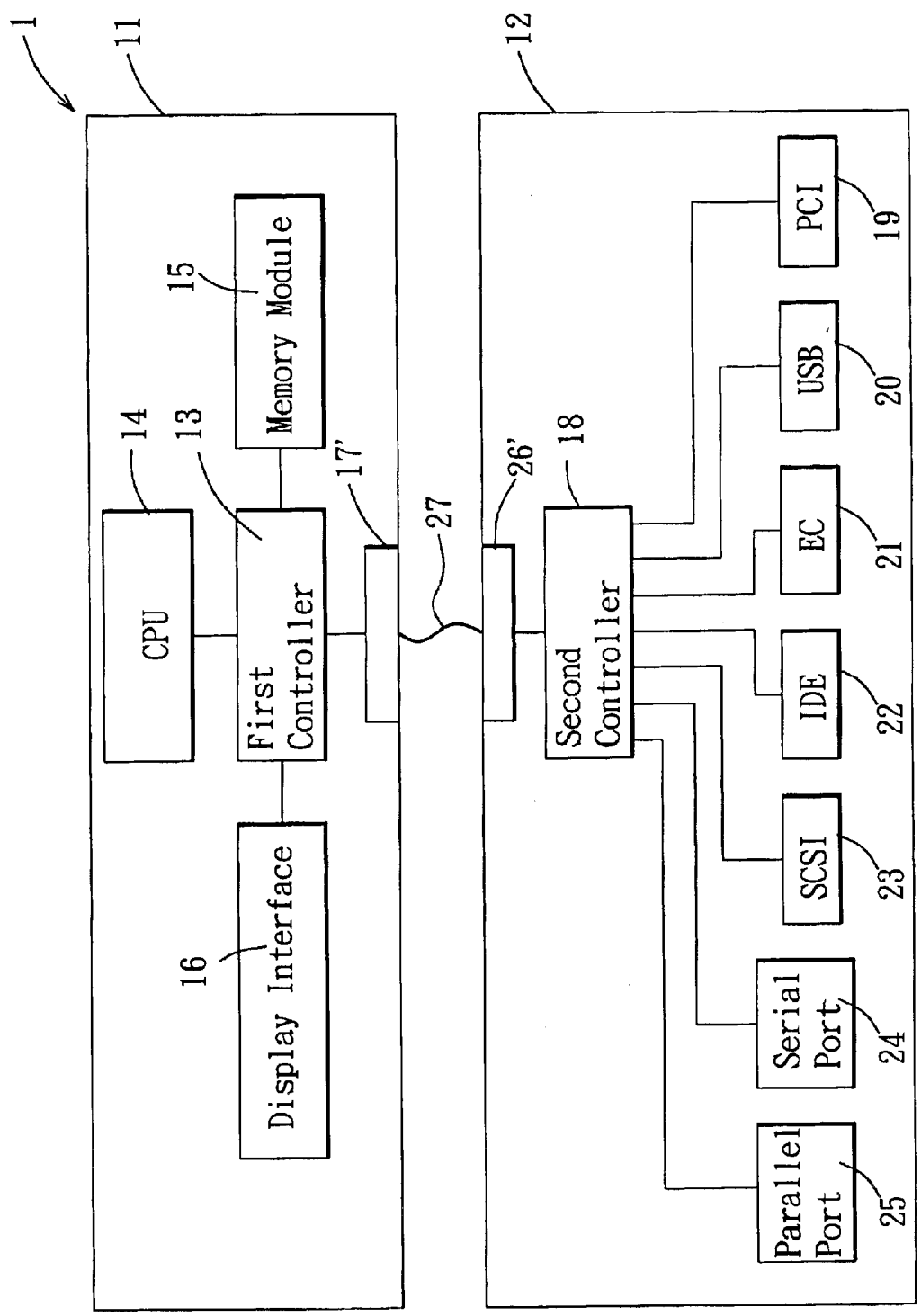
FIG. 3 is a schematic block diagram of the second preferred embodiment of a circuit board assembly according to the present invention.

FIG. 3 illustrates the second preferred embodiment of a circuit board assembly according to this invention. When compared with the previous preferred embodiment, the circuit board assembly 1 further comprises a signal cable 27 that has opposite ends connected removably to first and second electrical connectors 17', 26', respectively. In this embodiment, the first and second electrical connectors 17', 26' serve as the first and second communications units of the first and second circuit board devices.

Figure 4:
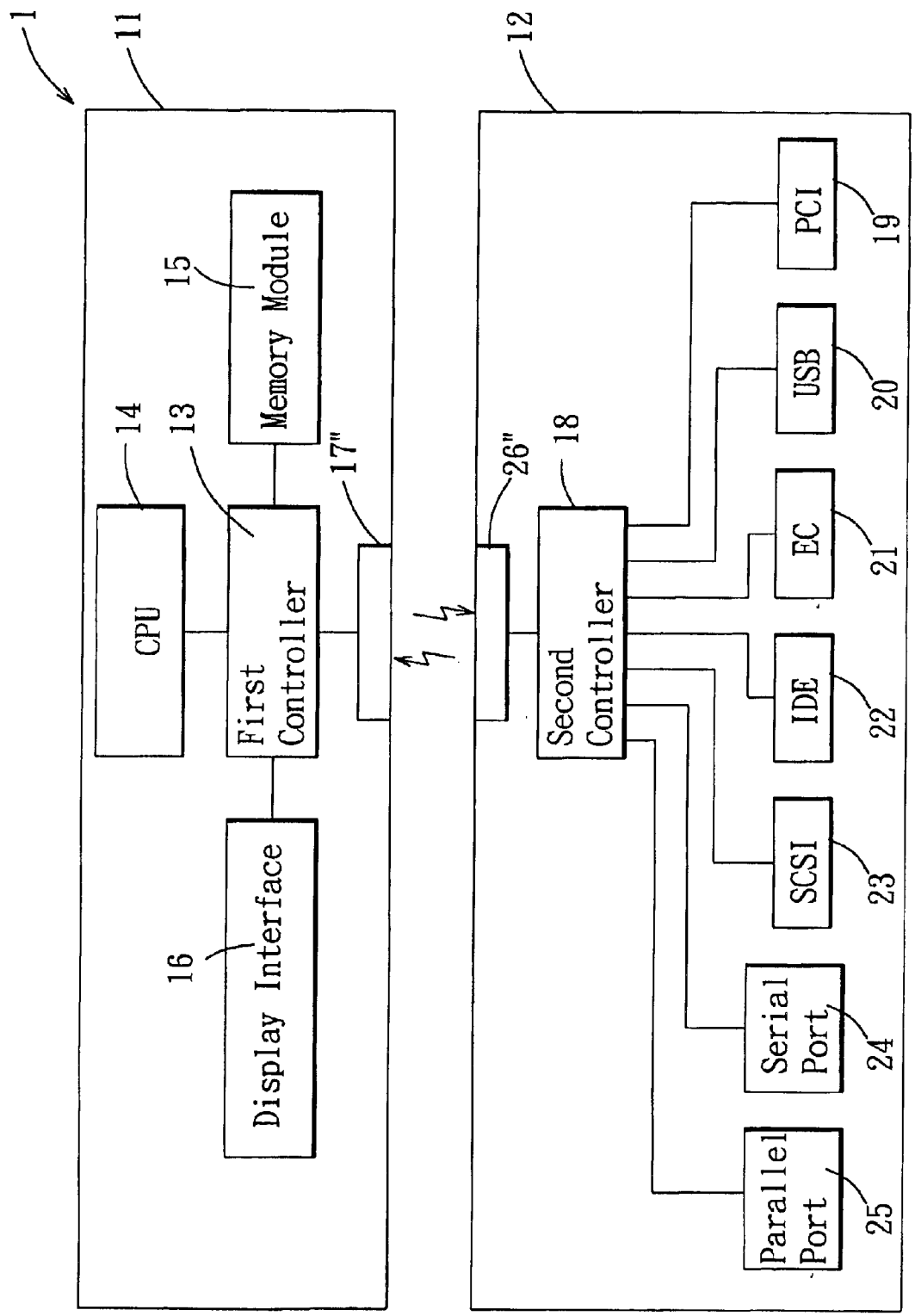
FIG. 4 is a schematic block diagram of the third preferred embodiment of a circuit board assembly according to the present invention.

FIG. 4 illustrates the third preferred embodiment of a circuit board assembly 1 according to this invention. When compared with the previous preferred embodiments, each of the first and second communications units 17", 26" is a wireless transceiver for establishing a wireless communications link for transmission and reception of signals between the first and second controllers 13, 18. Preferably, the first communications unit 17" is a first infrared transceiver, and the second communications unit 26" is a second infrared transceiver.

Therefore, a wired or wireless communications link connection can be used for transmission and reception of signals between the first and second controllers 13, 18.

It has thus been shown that the circuit board assembly 1 of this invention includes a first circuit board device having a first printed circuit board 11 and a first controller 13 mounted on the first printed circuit board 11, and a second circuit board device 12 having a second printed circuit board 12 that is separate from the first printed circuit board 11 and a second controller 18 mounted on the second printed circuit board 12. As such, when the first controller 13 needs to be upgraded, the first circuit board device can be replaced with a new one, and the second circuit board device can be reused. Similarly, when the second controller 18 needs to be upgraded, the second circuit board device can be replaced with a new one, and the first circuit board device can be reused. Accordingly, the aforesaid drawbacks of the prior art can be overcome.

While the present invention has been described in connection with what is considered the most practical and preferred embodiments, it is understood that this invention is not limited to the disclosed embodiment but is intended to cover various arrangements included within the spirit and scope of the broadest interpretation as to encompass all such modifications and equivalent arrangements.

We claim:

1. A circuit board assembly comprising:
    a first circuit board device including a first printed circuit board, a first controller mounted on said first printed circuit board, and a first communications unit mounted on said first printed circuit board and connected electrically to said first controller; and
    a second circuit board device including a second printed circuit board separate from said first printed circuit board, a second controller mounted on said second printed circuit board, and a second communications unit mounted on said second printed circuit board and connected electrically to said second controller;
    said second communications unit cooperating with said first communications unit to establish a communications link between said first and second controllers while maintaining separability between said first and second printed circuit boards,
    wherein each of said first and second communications units is a wireless transceiver.

2. The circuit board assembly as claimed in claim 1, wherein said first communications unit si a first electrical connector, and said second communications unit is a second electrical connector.

3. The circuit board assembly as claimed in claim 1, wherein said wireless transceiver is an infrared transceiver.

4. The circuit board assembly as claimed in claim 1, wherein said first circuit board device further includes at least one of a central processing unit, a memory module, and a display interface mounted on said first printed circuit board and connected electrically to said first controller.

5. The circuit board assembly as claimed in claim 1, wherein said second circuit board device further includes at least one of a peripheral component interconnect port, a universal serial bus port, an extended capability port, an integrated drive electronics port, a small computer system interface (SCSI) port, a serial port, and a parallel port mounted on said second printed circuit board and connected electrically to said second controller.

6. The circuit board assembly as claimed in claim 1, wherein said first controller is a north bridge chipset.

7. The circuit board assembly as claimed in claim 1, wherein said second controller is a south bridge chipset.

8. The circuit board assembly as claimed in claim 2, wherein said second electrical connector is capable of mating removably with said first electrical connector.

9. The circuit board assembly as claimed in claim 2, further comprising a signal cable having opposite ends connected to said first and second electrical connectors, respectively, at least one of said opposite ends of said signal cable being connected removably to the respective one of said first and second electrical connectors.

10. A circuit board assembly comprising:
    a first circuit board device including a first printed circuit board, a first controller mounted on said first printed circuit board, and a first communications unit mounted on said first printed circuit board and connected electrically to said first controller; and
    a second circuit board device including a second printed circuit board separate from said first printed circuit board, a second controller mounted on said second printed circuit board, and a second communications unit mounted on said second printed circuit board and connected electrically to said second controller;
    said second communications unit cooperating with said first communications unit to establish a communications link between said first and second controllers while maintaining separability between said first and second printed circuit boards,
    wherein:
    said first controller is a north bridge chipset, and said first circuit board device further includes at least one of a central processing unit, a memory module, and a display interface mounted on said first printed circuit board and connected electrically to said first controller; and
    said second controller is a south bridge chipset, and said second circuit board device further includes at least one of a peripheral component interconnect port, a universal serial bus port, an extended capability port, an integrated drive electronics port, a small computer system interface (SCSI) port, a serial port, and a parallel port mounted on said second printed circuit board and connected electrically to said second controller.

* * * * *